(12) United States Patent
Felcman et al.

(10) Patent No.: US 8,418,974 B2
(45) Date of Patent: Apr. 16, 2013

(54) MOUNTING ASSEMBLY FOR RACK EQUIPMENT

(75) Inventors: Chris F Felcman, Spring, TX (US);
Gary S. Landrum, Houston, TX (US);
Brandon W Fears, Houston, TX (US);
Wolfram A Rudiger, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 287 days.

(21) Appl. No.: 12/918,522

(22) PCT Filed: Feb. 20, 2008

(86) PCT No.: PCT/US2008/002264
§ 371 (c)(1),
(2), (4) Date: Aug. 20, 2010

(87) PCT Pub. No.: WO2009/105068
PCT Pub. Date: Aug. 27, 2009

(65) Prior Publication Data
US 2012/0061536 A1    Mar. 15, 2012

(51) Int. Cl.
*A47B 96/06* (2006.01)

(52) U.S. Cl.
USPC ........... 248/220.22; 248/289.11; 248/408; 211/26; 312/223.6; 361/827

(58) Field of Classification Search ............. 248/220.22, 248/289.11, 408; 211/26; 312/223.6, 333, 312/334.34, 334.47; 361/826, 827, 829
See application file for complete search history.

(56) References Cited

U.S. PATENT DOCUMENTS

| | | | |
|---|---|---|---|
| 6,882,530 B2 | 4/2005 | Cyphers et al. | |
| 6,902,069 B2 * | 6/2005 | Hartman et al. | 211/26 |
| 7,016,190 B1 * | 3/2006 | Chang | 361/679.33 |
| 7,019,963 B2 | 3/2006 | Lee et al. | |
| 7,364,533 B2 * | 4/2008 | Baker | 482/57 |
| 8,061,534 B2 * | 11/2011 | Laursen et al. | 211/26 |
| 2003/0222034 A1 * | 12/2003 | Champion et al. | 211/26 |
| 2003/0223199 A1 | 12/2003 | Smith et al. | |
| 2004/0120106 A1 | 6/2004 | Searby et al. | |
| 2005/0270751 A1 | 12/2005 | Coglitore et al. | |
| 2008/0062655 A1 * | 3/2008 | Laursen et al. | 361/733 |

OTHER PUBLICATIONS

International Search Report and Written Opinion, dated Nov. 20, 2008, 9 pages.

* cited by examiner

*Primary Examiner* — Anita M King

(57) ABSTRACT

A mounting assembly for mounting a piece of equipment, such as a power distribution unit to a rack. The mounting assembly includes a mounting bracket attached to the rack, a mounting plate attached to the equipment and a hinge assembly connecting the mounting plate to the first end of the mounting bracket while an attachment mechanism connects the mounting plate to the mounting bracket. A method of accessing the interior of the rack is also disclosed.

20 Claims, 2 Drawing Sheets

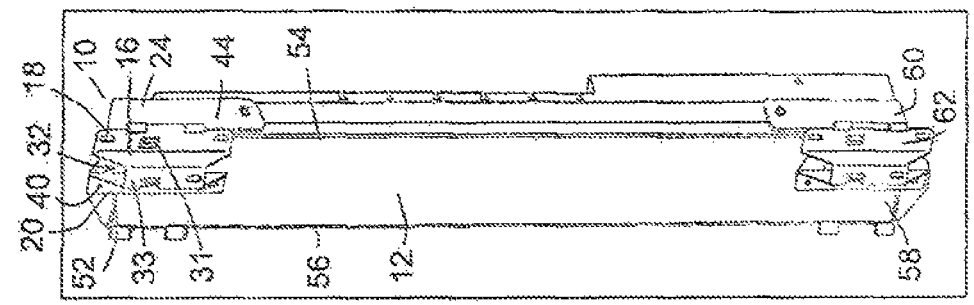
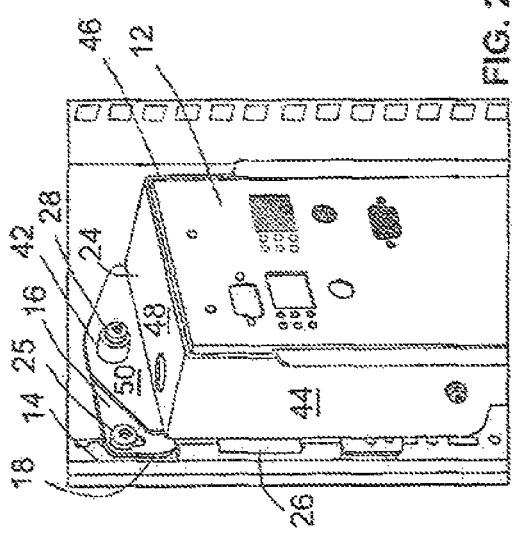
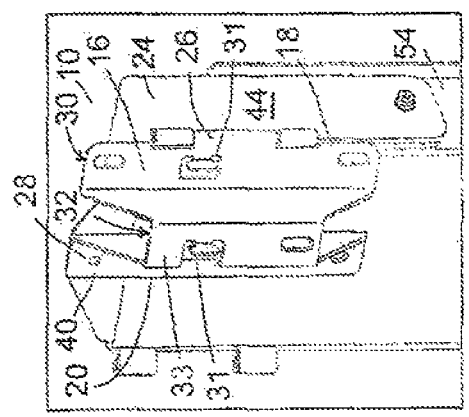
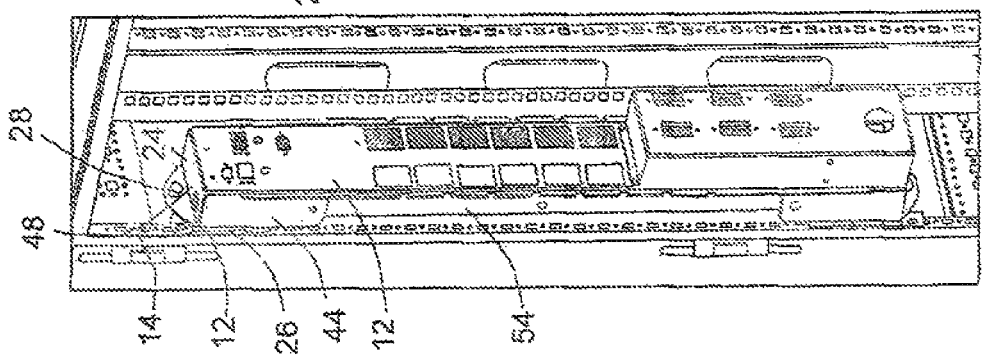

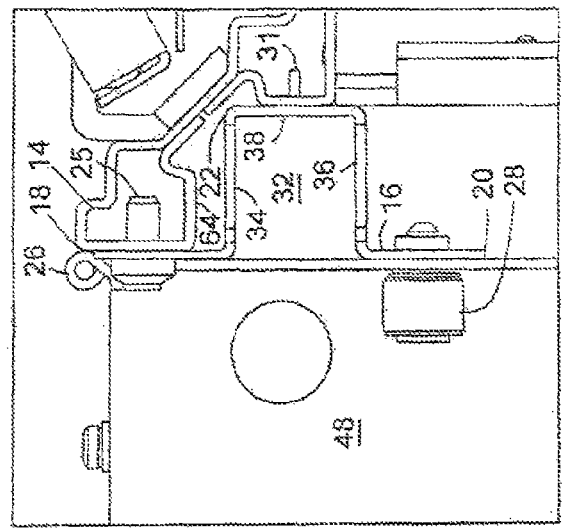
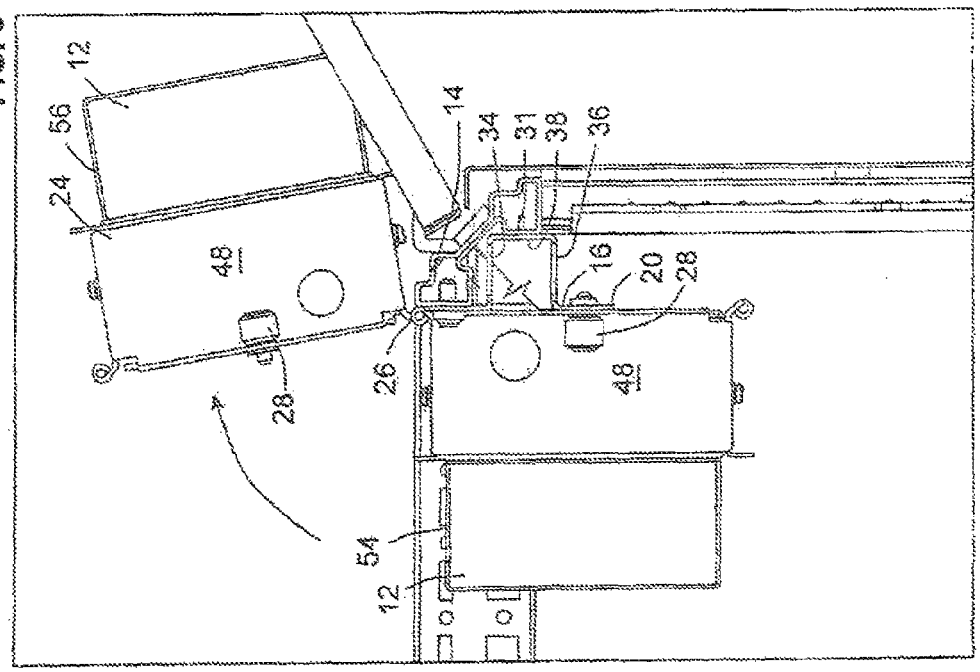

_US 8,418,974 B2_

MOUNTING ASSEMBLY FOR RACK EQUIPMENT

BACKGROUND

The equipment associated with many computer systems today is stored in racks arranged within a room or other enclosed space. Servers and other related equipment such as hot swappable power supplies, fans and boards that are necessary for the operation of an organization's computer system are stored within these racks.

In addition to the equipment stored in the racks, equipment, such as a power distribution unit ("PDU") or some types of electronic screens may be mounted on the inside of the rack itself. This internally mounted equipment presents a problem when a technician has to perform regular maintenance or repair to, or replace, a piece of equipment stored within the rack, because the PDU, for example, can block access to the other equipment.

In conventional rack arrangements, internally rack-mounted equipment has to be removed from the rack in order to gain access to equipment stored within the rack. This requires a technician to unscrew or unbolt the internal equipment from the rack, thereby requiring extra time and effort to complete a service call directed to equipment stored within the rack. Furthermore, once the service is completed; the technician must remount or secure the equipment to the inside of the rack. This extra work associated with equipment maintenance is not only time consuming, it can also result in lost or damaged equipment as mounting connectors may be lost or dropped on the removed equipment, or the equipment may be damaged during handling. In instances requiring removal of the PDU, power may be lost and system equipment may need to be powered down as the PDU power cables are disconnected.

A rack mounting assembly that would allow for equipment mounted internally remaining attached to the rack while being moved clear of the equipment stored within, so as to allow easy access to such equipment, would be an important improvement in the art.

BRIEF DESCRIPTION OF THE DRAWINGS

FIG. 1 is a perspective view showing a power distribution unit mounted to a rack.

FIG. 2 is a perspective view showing a front view of a power distribution unit and a mounting plate surrounding the first end of the unit secured to a mounting bracket.

FIG. 3 is a perspective view showing a rear view of a power distribution unit and a mounting bracket adjacent to a back side of the unit.

FIG. 4 is a perspective view showing a power distribution unit having a first and second mounting assembly attached to the back side of the respective first and second ends of the power distribution unit.

FIG. 5 is a top view showing a power distribution unit rotated approximately 180° from the mounting bracket.

FIG. 6 is a top view showing a power distribution unit positioned against the first side of a mounting bracket.

DETAILED DESCRIPTION OF THE EMBODIMENTS

The apparatus involves a mounting assembly 10 for mounting a piece of equipment 12, such as a power distribution unit to a rack 14. The mounting assembly 10, as shown in FIGS. 1-4, comprises a mounting bracket 16 having a first end 18 and a second end 20. The mounting bracket 16 is attached to the rack 14. A mounting plate 24 is attached to the equipment 12 and a hinge assembly 26 connects the mounting plate 24 to the first end 18 of the mounting bracket 16 while an attachment mechanism 28 connects the mounting plate 24 to the mounting bracket 16.

In an embodiment, a first side 30 of the mounting bracket 16 defines a channel 32 having a first and second side wall 34, 36 spaced apart from one another and a bottom wall 38 connecting said side walls 34, 36 where the bottom wall 38 is positioned within the rack 14. In another embodiment, at least one rack abutment member 31 extends from a second side 33 of the mounting bracket 16 opposite the first side 30. In a more particular version of this embodiment, the rack abutment members 31 are hooks.

In an embodiment, the first side 30 of the mounting bracket 16 defines a first opening 40, the mounting plate 24 defines a second opening 42, and the attachment mechanism 28 is a screw passing through the first and second openings 40, 42. In an embodiment the screw is a thumb screw, as shown in FIGS. 2, 5, and 6.

In an embodiment, the mounting plate 24 has a first side 44 and a second side 46 that is substantially parallel to and opposite the first side 44. A third side 48 of the mounting plate 24 connects the first and second sides 44, 46, the third side 48 being substantially perpendicular to the first and second sides 44, 46.

In an embodiment, a flange 50 extends substantially perpendicular from the mounting plate 24 and defines the second opening 42 through which the attachment mechanism 28 passes.

The equipment 12 mounted on the rack 14 may have a first end 52 having a first length. The third side 48 of the mounting plate 24 is located adjacent to the first end 52 of the equipment 12 and has a second length that approximately equal to the length of the first end 52, as shown in FIG. 2.

In an embodiment, the first and second sides 44, 46 of the mounting plate 24 are adjacent to a respective first and second side 54, 56 of the equipment 12. The equipment 12 may also have a second end 58 opposite from the first end 52, and a second mounting plate 60 may be attached adjacent to the second end 58 of the equipment 12. A second mounting bracket 62 is attached to the second mounting plate 60, as shown in FIG. 4.

When in operation, the mounting bracket 16 is positioned so that the first end 18 overlays a first side 64 of the rack 14 and the rack abutment portion 31 is adjacent to the first side 64 of the rack 14 while extending into the side 22 of the rack 14, as shown in FIGS. 5 and 6, where it helps support the weight of the equipment 12 to be mounted. The mounting bracket 16 can be attached to the rack 14 in any manner known in the art including, but not limited to, a mounting screw 25, as shown in FIG. 6. A mounting plate 24 is connected to the equipment 12 to be mounted on the rack 14, and an attachment mechanism 28 secures the mounting plate 24 to the mounting bracket 16. A side of the mounting plate 24 is then hinged 26 together with the first end 18 of the mounting bracket 16, as shown in FIGS. 1-6. This hinging of the mounting plate 24 to the mounting bracket 16 allows the equipment 12 to be rotated away from the rack 14 to allow access to equipment and cables stored in the rack 14.

As shown in FIG. 5, once a technician releases the attachment mechanism 28 securing the equipment 12 to the mounting bracket 16, he can rotate the equipment 12 mounted to the rack 14 anywhere from 0° to approximately 180° with respect to the first side 30 of the mounting bracket 16. This allows a technician to move the equipment 12 either partially or completely out of the way of the rack 14 in order to allow the necessary access to other equipment in the rack 14. When maintenance of the other equipment in the rack 14 is completed, the technician rotates the equipment 12 mounted to the rack 14 back into position and secures it to the rack 14 by affixing the attachment mechanism 28.

The attachment mechanism 28 can be any suitable connector such as a clamp, threaded screw, or thumb screw.

Also disclosed is a method for repositioning equipment mounted to a rack to allow access to an interior portion of the rack, the method is comprises providing a mounting bracket and a mounting plate, securing the mounting bracket to the rack, attaching the mounting plate to the equipment, hinging the mounting plate to the mounting bracket, and pivoting the mounting plate about the hinge so as to rotate the equipment clear of the rack.

The method may also include the steps of fastening the mounting plate to the mounting bracket via an attachment mechanism and releasing the attachment mechanism from the mounting bracket.

In another embodiment, the method further involves the steps of providing a second mounting bracket and a second mounting plate, securing the second mounting bracket to the rack, attaching the second mounting plate to the equipment at an end of the equipment opposite the first mounting plate, hinging the second mounting plate to the second mounting bracket, and pivoting the second mounting plate about a second hinge so as to rotate the equipment clear of the rack. This embodiment may also include the steps of fastening the second mounting plate to the second mounting bracket via a second attachment mechanism, and releasing the second attachment mechanism from the second mounting bracket.

In still another embodiment, the method further comprises the steps of servicing components stored within the rack, and re-pivoting the second mounting plate back to the mounting bracket. The method may also include the step of refastening the mounting plate to the mounting bracket.

The use of the terms "a" and "an" and "the" and similar referents in the context of describing the claimed apparatus, device, system or method (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the claimed apparatus, device, system or method and does not impose a scope limitation unless otherwise claimed. No language in the specification should be construed as indicating any non-claimed element as essential to the practice of the claimed apparatus, device, system or method.

Preferred embodiments of the claimed apparatus, device, system or method are described herein, including the best mode known to the inventors for practicing the claimed apparatus, device, system or method. It should be understood that the illustrated embodiments are exemplary only, and should not be taken as limiting the scope of the claimed apparatus, device, system or method.

What is claimed is:

1. A mounting assembly for mounting a piece of equipment to a rack, the mounting assembly comprising:
    a mounting bracket attached to the rack and having a first end, the mounting bracket defines a channel having spaced apart side walls and a bottom wall connecting said side walls, the bottom wall being positioned within the rack;
    a mounting plate attached to the equipment;
    a hinge assembly pivotably attaching the mounting plate to the first end of the mounting bracket; and
    an attachment mechanism for releasably attaching the mounting plate to the mounting bracket.

2. The mounting assembly of claim 1, wherein at least one rack abutment member extends from a second side of the mounting bracket opposite a first side.

3. The mounting assembly of claim 2, wherein the rack abutment member is a hook.

4. The mounting assembly of claim 1, wherein the equipment is a power distribution unit.

5. The mounting assembly of claim 1, wherein:
    a first side of the mounting bracket defines a first opening;
    the mounting plate defines a second opening; and
    the attachment mechanism is a fastener passing through the first and second openings.

6. The mounting assembly of claim 5, wherein:
    the mounting plate has a first side and a second side substantially parallel to and opposite said first side of said mounting bracket; and
    a third side connects the first and second sides of said mounting plate, said third side substantially perpendicular to said first and second sides of said mounting plate.

7. The mounting assembly of claim 5, wherein a flange extends substantially perpendicular from the mounting plate and said flange defines the second opening.

8. The mounting assembly of claim 5, wherein:
    the equipment has a first end having a length;
    the third side of the mounting plate is adjacent to the first end of the equipment and has a length approximately equal to the length of said first end.

9. The mounting assembly of claim 5, wherein the first and second sides of the mounting plate are adjacent to a respective first and second sides of the equipment.

10. The mounting assembly of claim 8, wherein:
    the equipment has a second end opposite the first end; and
    a second mounting plate is adjacent to said second end.

11. The mounting assembly of claim 10, wherein a second mounting bracket is hinged to the second mounting plate.

12. A method for repositioning equipment mounted to a rack to allow access to an interior portion of the rack, the method comprising:
    providing a mounting bracket and a mounting plate;
    securing the mounting bracket to the rack;
    attaching the mounting plate to the equipment;
    hinging the mounting plate to the mounting bracket;
    pivoting the mounting plate about the hinge so as to rotate the equipment clear of the rack;
    providing a second mounting bracket and a second mounting plate;
    securing the second mounting bracket to the rack;
    attaching the second mounting plate to the equipment at an end of the equipment opposite the first mounting plate;
    hinging the second mounting plate to the second mounting bracket; and
    pivoting the second mounting plate about a second hinge so as to rotate the equipment clear of the rack.

13. The method of claim 12 further comprising the step of fastening the mounting plate to the mounting bracket via an attachment mechanism.

14. The method of claim 13 further comprising the step of releasing the attachment mechanism from the mounting bracket.

15. The method of claim 12 further comprising the step of fastening the second mounting plate to the second mounting bracket via a second attachment mechanism.

16. The method of claim 15 further comprising the step of releasing the second attachment mechanism from the second mounting bracket.

17. The method of claim 12 further comprising the steps of:
  servicing components stored within the rack; and
  re-pivoting a second mounting plate back to the mounting bracket.

18. The method of claim 17 further comprising the step of refastening the mounting plate to the mounting bracket.

19. A mounting assembly for mounting a piece of equipment to a rack, the mounting assembly comprising:
  a mounting bracket attached to the rack, the mounting bracket includes a first end and a first side of the mounting bracket that defines a first opening;
  a mounting plate attached to the equipment, the mounting plate defines a second opening, the mounting plate has a first side, a second side, and a third side, the first side and the second side are substantially parallel to and opposite the first side of said mounting bracket, the first and second sides of the mounting plate are adjacent to a respective first and second sides of the equipment, the third side connects the first and second sides of the mounting plate, the third side is substantially perpendicular to the first and second sides of the mounting plate;
  a hinge assembly pivotably attaching the mounting plate to the first end of the mounting bracket; and
  an attachment mechanism for releasably attaching the mounting plate to the mounting bracket, the attachment mechanism includes a fastener passing through the first and second openings.

20. The mounting assembly of claim 19, wherein a flange extends substantially perpendicular from the mounting plate and the flange defines the second opening.

* * * * *